(12) United States Patent
Sao et al.

(10) Patent No.: US 8,852,855 B2
(45) Date of Patent: Oct. 7, 2014

(54) UPPER SURFACE ANTIREFLECTIVE FILM FORMING COMPOSITION AND PATTERN FORMING METHOD USING SAME

(75) Inventors: Takayuki Sao, Shizuoka (JP); Tomohide Katayama, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 14/110,324

(22) PCT Filed: Apr. 11, 2012

(86) PCT No.: PCT/JP2012/059893
§ 371 (c)(1),
(2), (4) Date: Oct. 7, 2013

(87) PCT Pub. No.: WO2012/141209
PCT Pub. Date: Oct. 18, 2012

(65) Prior Publication Data
US 2014/0030661 A1 Jan. 30, 2014

(30) Foreign Application Priority Data

Apr. 12, 2011 (JP) ................................ 2011-088401

(51) Int. Cl.
G03F 7/09 (2006.01)
G03F 7/20 (2006.01)
G03F 7/11 (2006.01)
H01L 21/027 (2006.01)

(52) U.S. Cl.
CPC ........ G03F 7/091 (2013.01); G03F 7/20 (2013.01); G03F 7/11 (2013.01)
USPC ......... 430/325; 430/326; 430/273.1; 524/157

(58) Field of Classification Search
None
See application file for complete search history.

(56) References Cited

U.S. PATENT DOCUMENTS

| 6,309,789 | B1 | 10/2001 | Takano et al. |
| 7,365,115 | B2 | 4/2008 | Akiyama et al. |
| 2007/0196763 | A1 | 8/2007 | Araki et al. |
| 2010/0286318 | A1 | 11/2010 | Akiyama et al. |

FOREIGN PATENT DOCUMENTS

| JP | 3673399 B2 | 7/2005 |
| JP | 2008-112779 A | 5/2006 |
| JP | 3851594 B2 | 9/2006 |
| JP | 2007-108463 A | 4/2007 |
| JP | 3965740 B2 | 6/2007 |
| JP | 2009-145658 A | 7/2009 |
| JP | 4400572 B2 | 11/2009 |
| JP | 4525829 B2 | 6/2010 |
| WO | WO 2005/050320 A1 | 6/2005 |
| WO | WO 2007/043556 A1 | 4/2007 |

OTHER PUBLICATIONS

English Language Abstract from espacenet of JP 3965740 B2.

*Primary Examiner* — Cynthia Hamilton
(74) *Attorney, Agent, or Firm* — Sangya Jain

(57) ABSTRACT

[Object] To provide a top anti-reflection coating composition equal or superior to known products in film-formability, in refractive index, in temporal stability and in safety; and also to provide a pattern formation method using the same. [Means] A top anti-reflection coating composition comprising a solvent, an alkylsulfonic acid having 10 to 18 carbon atoms, and a fluorine-containing polymer having a weight average molecular weight of 300000 to 800000 and represented by the formula (1): $-A_x-B_y-$ (1). In the formula (1), A is a repeating unit represented by the formula (A): (R is a fluorine-containing alkylene group having 1 to 40 carbon atoms or R is a fluorine-containing alkylene group having 2 to 100 carbon atoms and an ether bond); B is a repeating unit capable of combining with A to form a copolymer; x and y are numbers indicating the polymerization ratios, provided that x is not equal to 0; and A and B may randomly combine with each other or may form blocks.

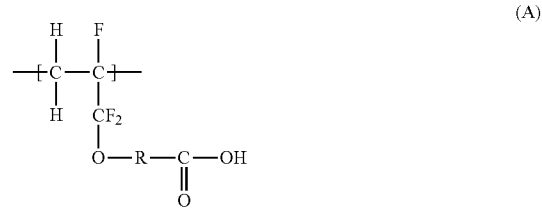

20 Claims, No Drawings

UPPER SURFACE ANTIREFLECTIVE FILM FORMING COMPOSITION AND PATTERN FORMING METHOD USING SAME

This application is a United States National Stage Patent Application under 35 U.S.C §371 of International Patent Application No. PCT/JP 2012/059893, filed Apr. 11, 2012.

TECHNICAL FIELD

The present invention relates to a top anti-reflection coating composition. Specifically, this invention relates to a composition for forming an anti-reflection coating provided on the top surface of a resist film when the resist film is subjected to exposure in a photolithographic process for manufacturing flat panel displays (FPDs), such as, liquid crystal displays, semiconductor devices, charge-coupled devices (CCDs), color filters or the like. The present invention also relates to a pattern formation method employing that top anti-reflection coating composition.

BACKGROUND ART

In the manufacture of FPDs such as liquid crystal displays, semiconductor devices, CCDs, color filters or the like, photolithography has hitherto been used. For example, in a photolithographic process for producing integrated circuits, a positive- or negative-working resist is cast on a substrate, baked to remove the solvent, then exposed to radiation such as UV light, far UV light, electron beams or X-rays, and finally developed to form a resist pattern.

However, in many cases, the substrate used in the process has a high reflectance. Accordingly, in the exposure step, light passing through the resist layer is often reflected by the substrate and then reenters the resist layer, so that the light is applied to the resist layer even in areas not expected to be exposed. As a result, the aimed pattern often cannot be obtained or the obtained pattern may have unfavorable defects. Further, reflection of the light at the interface between the substrate and the resist layer often causes a standing-wave effect to corrugate the resist layer, and consequently serious troubles may occur in controlling the line width of the resist pattern. Those phenomena are remarkable particularly when light of a shorter wavelength is used in the exposure step for forming a finer pattern.

As a method for solving the above problems, it is proposed to provide a top anti-reflection coating. Specifically, for the purposes of reducing unfavorable reflection of light in the resist layer and thereby of improving the dimension accuracy, it is proposed that a top anti-reflection coating having a proper refractive index be formed on the top surface of the resist layer.

In order to attain the above purposes, it is studied to adopt a fluorine-containing compound as a component of the top anti-reflection coating (Patent documents 1 to 3). However, there are some points to improve. For example, in view of the safety, the fluorine-containing compounds disclosed in those documents have restrictions on the production process and on the use thereof. Further, since they have low solubility to water, it is necessary to use costly fluorine-containing solvents together. Although it is also studied to prepare a top anti-reflection coating composition by use of a fluorine-containing compound having improved solubility (Patent documents 4 and 5), the inventors have found that not all the compositions disclosed in the documents can have sufficient effects and hence that there are room for improvement to make the compositions satisfactory in all the respects, such as, film-formability, refractive index and temporal stability. In addition, although the low molecular weight fluorine compounds disclosed in Patent document 1 function as an essential component for realizing a low refractive index in the top anti-reflection coating, it is becoming difficult to employ them practically in consideration of the recent safety standards. Accordingly, it is desired to provide a top anti-reflection coating composition also satisfactory in safety.

PRIOR ART DOCUMENTS

Patent Documents

[Patent document 1] Japanese Patent No. 3673399
[Patent document 2] Japanese Patent No. 3851594
[Patent document 3] Japanese Patent No. 3965740
[Patent document 4] Japanese Patent No. 4400572
[Patent document 5] Japanese Patent No. 4525829

DISCLOSURE OF INVENTION

Problem to be Solved by the Invention

It is an object of the present invention to provide a top anti-reflection coating composition satisfying the required properties in all the respects, such as, film-formability, refractive index, temporal stability and safety.

Means for Solving Problem

A top anti-reflection coating composition according to the present invention, which is used in a photolithographic process for forming a pattern by use of light; comprising
a solvent,
an alkylsulfonic acid having 10 to 18 carbon atoms, and
a fluorine-containing polymer having a weight average molecular weight of 300000 to 800000 and represented by the following formula (1): -$A_x$-$B_y$- (1) in which
A is a repeating unit represented by the following formula (A):

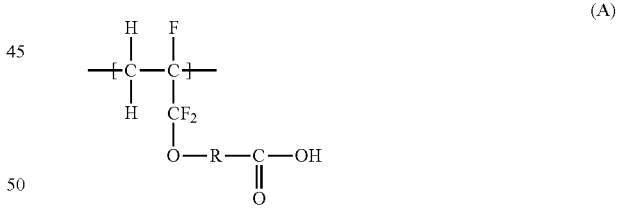

wherein R is a fluorine-containing alkylene group having 1 to 40 carbon atoms or R is a fluorine-containing alkylene group having 2 to 100 carbon atoms and an ether bond,
B is a repeating unit capable of combining with A to form a copolymer,
x and y are numbers indicating the polymerization ratios provided that x is not equal to 0, and
A and B may randomly combine with each other or may form blocks.

A pattern formation method according to the present invention comprising the steps of: coating a substrate with a resist composition to form a resist film; coating said resist film with the above top anti-reflection coating composition; drying said composition; conducting exposure by use of light; and then carrying out development.

Effect of the Invention

The present invention provides a new top anti-reflection coating composition used for forming a resist pattern. This composition has enough properties, such as, film-formability, temporal stability and safety, to use practically in a recent photolithographic process, and also enables to form an anti-reflection coating having a sufficiently low refractive index.

BEST MODE FOR CARRYING OUT THE INVENTION

Embodiments of the present invention will be described below in detail.

The top anti-reflection coating composition according to the present invention comprises a particular fluorine-containing polymer, a particular alkylsulfonic acid, a particular solvent, and, if necessary, other components. Those components are individually explained as follows.

Fluorine-containing Polymer

The fluorine-containing polymer adopted in the present invention is represented by the following formula (1): -$A_x$-$B_y$- (1). In the formula, each of A and B is a repeating unit, and x and y are numbers indicating the polymerization ratios provided that x is not equal to 0. The repeating units A and B may randomly combine with each other or may form blocks.

In the formula (1), A is a repeating unit represented by the following formula (A):

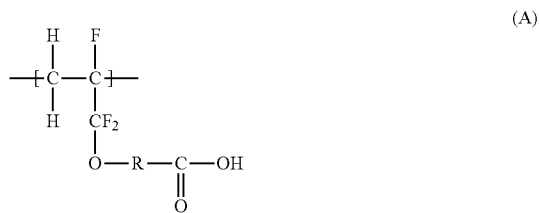

wherein R is a fluorine-containing alkylene group having 1 to 40, preferably 1 to 10 carbon atoms or otherwise a fluorine-containing alkylene group having 2 to 100, preferably 2 to 50 carbon atoms, and an ether bond.

Examples of the fluorine-containing alkylene group serving as R include: —($CF_2O$)—, —($CF(CF_3)O$)—, —($CF_2CF_2O$)—, —($CF(CF_3)CF_2O$)—, —($CF(CF_3)CF_2CF_2O$)—, —($CF_2$)—, and other divalent groups in which fluorine atoms in those groups are partly replaced with hydrogen atoms.

Specifically, R is preferably selected from the group consisting of:
—$CF_2O$—
—$CF(CF_3)$—
—$CF(CF_3)CF_2OCF(CF_3)$—
—$CF(CF_3)CF_2OCF(CF_3)CF_2OCF(CF_3)$—$CF(CF_3)CH_2$— and
—$CF(CF_3)CF_2OCF(CF_3)CH_2$—$CF(CF_3)CF_2OCF(CF_3)$ $CF_2OCF(CF_3)CH_2$—.

In order that the resultant top anti-reflection coating can have a low refractive index or that the polymer can have high solubility to water, R preferably contains hydrogen atoms in a small amount and further preferably contains no hydrogen atoms.

The fluorine-containing polymer may comprise two or more kinds of the repeating units represented by the formula (A) but having different Rs.

In the formula (1), B is a repeating unit capable of combining with A to form a copolymer. In the case where the fluorine-containing polymer comprises a repeating unit (B), the repeating unit (B) can be freely selected according to necessity. The repeating unit (B) can be derived from, for example, a fluorine-containing hydrocarbon having an ethylenic unsaturated bond. Examples thereof include:
—$CF_2CF_2$—,
—$CF_2CHF$—,
—$CF_2CH_2$—,
—$CF_2CF(CF_3)$—,
—$CF_2CFCl$—, and
—$CH_2CH(CF_3)$—.

In the present invention, the fluorine-containing polymer necessarily comprises the repeating unit (A). In other words, it is necessary for x not to be equal to 0. However, the polymerization degrees of the repeating units (A) and (B) are properly controlled according to the aimed use. If consisting of only the repeating unit (A), the fluorine-containing polymer of the present invention tends to be improved in refractive index and in film-formability. Accordingly, that is preferred. In that case, the polymer may comprise two or more kinds of the repeating units represented by the formula (A). On the other hand, however, if comprising the repeating unit (B), the polymer can be often improved in solubility to water.

For the reasons described above, the polymerization ratios x and y of the repeating units (A) and (B), respectively, are:
preferably $0.55 \leq x \leq 1.00$ and $0 \leq y \leq 0.45$,
more preferably $0.7 \leq x \leq 1.00$ and $0 \leq y \leq 0.3$, and
further preferably $0.9 \leq x \leq 1.00$ and $0 \leq y \leq 0.1$.

Further, the fluorine-containing polymer according to the present invention has a molecular weight properly controlled according to the coatability of the composition and to the thickness of the anti-reflection coating intended to be formed. However, if having too small a molecular weight, the polymer may have such an effect on the resist layer that the resist film after development tends to have a thin thickness. In contract, if having too large a molecular weight, the polymer may cause problems, such as, impairment of temporal stability, increase of composition viscosity, and lowering of solubility to water. Accordingly, the fluorine-containing polymer of the present invention has a weight average molecular weight of necessarily 300000 to 800000, preferably 350000 to 450000. Here, the "weight average molecular weight" in the present invention is a value calculated on the basis of the standard curve obtained from gel permission chromatographic measurement of polyethylene oxide or polyethylene glycol as the reference substance. The weight average molecular weights of 300000 and 800000 can be reduced into number average molecular weights of about 180000 and about 300000, respectively.

The above fluorine-containing polymer satisfies the recent safety standards, and hence is less dangerous for manufacturers and users. Accordingly, the polymer is a preferred material.

Alkylsulfonic Acid

The top anti-reflection coating composition of the present invention comprises an alkylsulfonic acid having 10 to 18 carbon atoms. The alkylsulfonic acid is presumed to function as a surfactant.

There are generally known surfactants, such as, anionic surfactants, cationic surfactants, and nonionic surfactants. However, if contained in the top anti-reflection coating composition of the present invention, cationic or nonionic surfactants cloud the composition because of their poor water-solubility. Accordingly, it is impossible to adopt them.

On the other hand, alkylsulfonic acids are categorized into anionic surfactants. However, the present inventors have found that anionic surfactants other than the alkylsulfonic acid having 10 to 18 carbon atoms cannot bring the effect of the present invention. Specifically, for example, compounds having no sulfo groups (—SO$_3$H), such as, alkylcarboxylic acids, are unusable because they have such poor water-solubility as to cloud the composition. Further, if comprising an alkylsulfonic acid having a less number of carbon atoms, the composition is repelled and hence difficult to form an even coating when cast on the resist film. If comprising an alkylsulfonic acid having a more number of carbon atoms, the composition has poor temporal stability.

There are some known alkylsulfonic acids having plural sulfo groups, and they are employable. However, alkylsulfonic acids having plural sulfo groups have a relatively small effect of improving the coatability of the coating composition according to the present invention. Accordingly, the alkylsulfonic acid adopted in the present invention is preferably represented by the formula: $H(CH_2)_n SO_3 H$ (n=10 to 18).

Further, there are some known anionic surfactants other than alkylsulfonic acids. However, for example, surfactants having aromatic rings, such as, alkyl-benzenesulfonic acids, have too poor temporal stability to use practically.

For the reasons described above, only the alkylsulfonic acid having 10 to 18 carbon atoms can be used as a surfactant in the present invention.

Solvent

In the top anti-reflection coating composition according to the present invention, water is most preferably used as the solvent. The water is preferably subjected to distillation, ion-exchange treatment, filtration treatment and/or various adsorption treatments, so as to remove organic impurities, metal ions and the like.

In the case where water is adopted as the solvent, it is possible to use a water-soluble organic solvent together with water in order to improve coatability of the anti-reflection coating composition. There are no particular restrictions on the water-soluble organic solvent as long as it can be dissolved in water in an amount of 0.1 wt % or more. Examples thereof include: alcohols, such as, methyl alcohol, ethyl alcohol and isopropyl alcohol; ketones, such as, acetone and methyl ethyl ketone; esters, such as, methyl acetate, ethyl acetate and ethyl lactate; and other polar solvents, such as, dimethylformamide, dimethyl sulfoxide, methyl cellosolve, cellosolve, butyl cellosolve, cellosolve acetate, alkylcellosolve acetate, butylcarbitol and carbitol acetate. However, if used in the top anti-reflection coating composition, the organic solvent should be so selected as not to damage the resist on which the composition is intended to be applied.

Other Additional Components

The top anti-reflection coating composition of the present invention can comprise other additional components according to necessity. The additional components are, for example, as follows.

(a) No Fluorine-Containing Polymer Having a Carboxy Group

The top anti-reflection coating composition according to the present invention can be used in various methods for forming resist patterns. In the case where a resist pattern is formed by exposure to short-wavelength light, such as, KrF excimer laser beams, the top anti-reflection coating is required to have a very low refractive index. In that case, it is possible to form a favorable top anti-reflection coating from the composition in which only the fluorine-containing polymer represented by the formula (1) is adopted as a film-forming component. However, there is also a case where a resist pattern is formed by exposure to light of relatively long wavelength, such as, i-line light. In that case, the top anti-reflection coating may have a higher refractive index than required when the resist pattern is formed by exposure to relatively short-wavelength light, and hence the fluorine-containing polymer of the formula (1) as a film-forming component may be partly replaced with a no fluorine-containing polymer having a carboxy group. This means that a no fluorine-containing polymer having a carboxy group can be employed as an additional component. Accordingly, if a resist pattern is intended to be formed by use of a photolithographic process comprising exposure to light in a wavelength of 300 nm or more, such as, i-line light, the top anti-reflection coating composition can contain a no fluorine-containing polymer having a carboxy group.

Examples of the no fluorine-containing polymer having a carboxy group include: polyacrylic acid, polymethacrylic acid, poly-α-trifluoromethylacrylic acid, poly(N-vinylpyrrolidone-co-acrylic acid), poly(methyl N-vinylpyrrolidone-co-acrylate), poly(N-vinylpyrrolidone-co-methacrylic acid), and poly(methyl N-vinyl-pyrrolidone-co-methacrylate).

There are no particular restrictions on the weight average molecular weight of the no fluorine-containing polymer having a carboxy group. However, it is normally 1000 to 50000, preferably 2000 to 20000.

(b) Amine Compound

The top anti-reflection coating composition according to the present invention can be applied to various resist patterns. Among them, there are patterns derived from chemically amplified resists. The chemically amplified resists are often adopted particularly in the case where a resist pattern is formed by use of light in the wavelength range of 300 nm or less, such as, KrF excimer laser beams. The chemically amplified resist generates an acid when exposed to light, and the acid acts to form a resist pattern. Accordingly, if the top anti-reflection coating composition having high acidity is applied on the resist pattern, it is feared that the resist pattern may be thinned by the composition. To cope with this problem, an amine compound may be added so as to decrease the acidity of the top anti-reflection coating composition.

In the present invention, the amine compound can be selected from the group consisting of monoalkanol amines, dialkanol amines, trialkanol amines, and monoalkyl amines. If an amine compound other than those is adopted, it may impair film-formability of the top anti-reflection coating composition.

The amine compound preferably has high solubility to water. In view of that, the amine compound preferably has 1 to 6 carbon atoms. Further, in view of the availability and the treatability, monoethanol amine is the most preferred amine compound.

(c) Other Additional Components

In addition to the above components, the top anti-reflection coating composition of the present invention can further contain various additives according to necessity. Examples of the additives include thickening agents, slip agents, and colorants such as dyes.

Top Anti-reflection Coating Composition

The top anti-reflection coating composition according to the present invention is prepared by mixing the above components and then dissolving them homogeneously. The content of each component is properly controlled according to the aimed use.

Specifically, in the top anti-reflection coating composition of the present invention, the content of the polymer is preferably 0.1 to 50 wt %, more preferably 0.5 to 10 wt %, particularly preferably 1 to 5 wt %, based on the total weight of the composition. Here, "the content of the polymer" means the total amount of the fluorine-containing polymer represented by the formula (1) and the no fluorine-containing polymer having a carboxy group, the latter of which is optionally incorporated according to necessity.

The more the composition of the present invention contains the alkylsulfonic acid, the more it tends to be improved in refractive index and in reduction of film thickness. However, the content of the alkylsulfonic acid is preferably not too large. Specifically, the composition contains the alkylsulfonic acid in an amount of preferably 0.002 to 0.4 wt %, more preferably 0.02 to 0.2 wt %, particularly preferably 0.05 to 0.2 wt %, based on the total weight of the composition.

Further, if the composition according to the present invention contains the amine compound, the content thereof is preferably 0.3 wt % or less, more preferably 0.2 wt % or less, based on the total weight of the composition. If the composition contains the amine compound too much, the resultant top anti-reflection coating tends to have a high refractive index. That should be paid attention to.

In the top anti-reflection coating composition of the present invention, the amount of the fluorine polymer is preferably 50 wt % or more, more preferably 70 wt % or more, based on the total weight of all the polymers contained in the composition. If the composition according to the present invention contains too large an amount of the no fluorine-containing polymer having a carboxy group, the resultant top anti-reflection coating tends to have a high refractive index. Accordingly, it is preferred for the composition not to contain too large an amount of the no fluorine-containing polymer having a carboxy group.

In the present invention, the amine compound and the no fluorine-containing polymer having a carboxy group are optionally adopted according to necessity. Unless impairing the effect of the present invention, they may be used in combination.

The contents of additives other than the amine compound and the no fluorine-containing polymer having a carboxy group are individually determined in view of the effect of each additive, but the composition contains each additive in an amount of generally 1 wt % or less, preferably 0.1 wt % or less, based on the total weight of the composition.

Pattern Formation Method

The top anti-reflection coating composition according to the present invention can be used in the same manner as a conventional one. In other words, it is unnecessary to change the pattern formation process essentially when the composition of the present invention is practically used. The pattern formation method employing the top anti-reflection coating composition of the present invention is concretely explained below.

First, a resist composition is cast by a known coating method such as spin-coating to form a resist composition layer on a substrate such as a silicon or glass substrate, which may be pre-treated, if necessary. Before the resist composition is applied, a bottom anti-reflection coating may be previously provided under the resist by coating. The bottom anti-reflection coating can improve the section shape and the exposure margin in cooperation with the top anti-reflection coating to be formed from the composition of the present invention.

Any known resist composition can be used in the pattern formation method of the present invention. Representative examples of the resist compositions usable in the present invention include: positive-working compositions, such as, a composition comprising a quinonediazide type photosensitive substance and an alkali-soluble resin, and a chemically amplified resist composition; and negative-working compositions, such as, a composition comprising a photosensitive functional group-containing polymer such as polyvinyl cinnamate, a composition comprising an azide compound such as an aromatic azide compound or a bisazide compound with a cyclized rubber, a composition comprising a diazo resin, a photo-polymerizable composition comprising an addition-polymerizable unsaturated compound, and a chemically amplified negative-working resist composition.

Examples of the quinonediazide type photosensitive substance used in the positive-working composition comprising a quinonediazide type photosensitive substance and an alkali-soluble resin include: 1,2-benzoquinonediazide-4-sulfonic acid, 1,2-naphtho-quinonediazide-4-sulfonic acid, 1,2-naphthoquinone-diazide-5-sulfonic acid, and sulfonic esters or amides thereof. Examples of the alkali-soluble resin include: novolak resin, polyvinyl phenol, polyvinyl alcohol, and copolymers of acrylic acid or methacrylic acid. The novolak resin is preferably prepared from one or more phenols such as phenol, o-cresol, m-cresol, p-cresol and xylenol in combination with one or more aldehydes such as formaldehyde and paraformaldehyde.

Either positive- or negative-working chemically amplified resist composition can be used in the pattern formation method of the present invention. The chemically amplified resist generates an acid when exposed to radiation, and the acid serves as a catalyst to promote chemical reaction by which solubility to a developer is changed within the areas irradiated with the radiation to form a pattern. For example, the chemically amplified resist composition which comprises an acid-generating compound generating an acid when exposed to radiation, and an acid-sensitive functional group-containing resin decomposing in the presence of acid to form an alkali-soluble group such as phenolic hydroxyl or carboxyl group can be utilized. The composition which comprises an alkali-soluble resin, a crosslinking agent and an acid-generating compound can also be utilized.

The resist composition layer formed on the substrate is prebaked, for example, on a hot plate to remove solvent contained in the composition, to form a photoresist film. The prebaking temperature depends on the solvent and the resist composition, but is normally 20 to 200° C., preferably 50 to 150° C.

On the formed resist film, the top anti-reflection coating composition of the present invention is cast by spin-coating or the like and then the solvent is evaporated to form a top anti-reflection coating. The top anti-reflection coating thus obtained has a thickness of generally 1 to 100 nm, preferably 10 to 80 nm, more preferably 15 to 70 nm.

In the above process, before the resist composition layer formed on the substrate is completely dried, the top anti-reflection coating composition may be applied thereon. Even so, the solvent of the top anti-reflection coating composition can be removed by the prebaking described above.

The top anti-reflection coating thus formed can realize a refractive index of generally 1.40 to 2.00, preferably 1.40 to 1.55. This means that the present invention enables to realize as low a refractive index as 1.50 or less, further 1.45 or less. Since having such a low refractive index, the top anti-reflection coating according to the present invention exhibits excellent properties.

The resist film is then exposed through a mask, if necessary, to light, such as, KrF laser beams or i-line light.

After the exposure, baking treatment may be carried out, if necessary, and then development such as paddle development is carried out to form a resist pattern. The resist film is normally developed with an alkali developer. Since the polymer contained in the composition of the present invention has a hydrophilic group, the anti-reflection coating is easily removed with the developer.

Examples of the alkali developer used in the present invention include an aqueous solution of sodium hydroxide or tetramethylammonium hydroxide (TMAH). After the development, the resist pattern is rinsed (washed) with a rinse solution, preferably, pure water, if necessary. The resist pattern thus-formed is employed as a resist for etching, plating, ion diffusion or dyeing, and then, if necessary, peeled away.

The thickness of the resist pattern is properly determined according to the aimed use, but is in the range of generally 0.1 to 3 μm, preferably 0.2 to 2 μm.

The resist pattern obtained by the pattern formation method of the present invention is then further fabricated or processed according to the aimed use. The pattern formation method of the present invention by no means restricts the subsequent procedures, and hence the resist pattern can be fabricated or processed in known manners.

The pattern formed by the method of the present invention can be employed for the manufacture of flat panel displays (FPDs) such as liquid crystal displays, semiconductor devices, charge-coupled devices (CCDs), color filters and the like, in the same manner as patterns formed by the conventional method are employed for.

The present invention is further explained by use of the following examples.

Examples 1 to 25

Fluorine-containing polymers represented by the formula (1) but having different weight average molecular weights were prepared. Each of the polymers was dissolved in water as a solvent together with an alkylsulfonic acid or with a comparative surfactant, to obtain a top anti-reflection coating composition. The alkylsulfonic acid or comparative surfactant was selected from the group consisting of S-1: a mixture of alkylsulfonic acids having 10 to 18 carbon atoms,
S-2: acetylenediol ethyleneoxide adduct (Surfynol 485 [trademark], manufactured by Air Products and Chemicals. Inc.), nonionic surfactant,
S-3: polyoxyethylene lauryl amino ether (D-3110-P [trademark], manufactured by TAKEMOTO OIL & FAT Co., Ltd.), nonionic surfactant,
S-4: a mixture of alkyldiphenylether sulfonic acids having 12 carbon atoms on average,
S-5: ethanesulfonic acid,
S-6: octanesulfonic acid,
S-7: camphorsulfonic acid,
S-8: p-toluenesulfonic acid, and
S-9: dodecylbenzenesulfonic acid.

The content of the fluorine-containing polymer in each composition was controlled to be 2.0 wt % based on the total weight of the composition. Further, Table 1 shows the weight average molecular weight of the fluorine-containing polymer and the content of the alkylsulfonic acid or surfactant in each composition.

Each composition was evaluated in accordance with the criteria described below.

With respect to the film-formability, each composition was cast on a silicon wafer by means of a spin coater (CLEANT-RACK MK-8 type [trademark], manufactured by Tokyo Electron Limited) and then observed with the eyes to classify into the following grades:
A: the composition was not repelled at all,
B: the composition was repelled in an area of about 10%,
C: the composition was repelled in an area of about 30%, and
D: the composition was repelled in an area of about 50% or more.

After the above film-formability evaluation, each composition was successively evaluated on the in-plane evenness by means of a spectral interference thickness meter (Lambda Ace [trademark], manufactured by Dainippon Screen Mfg. Co., Ltd.), and thereby classified into the following grades:
A: the film thickness was distributed in the range of less than 10 Å,
B: the film thickness was distributed in the range of 10 to 20 Å,
C: the film thickness was distributed in the range of 20 to 30 Å, and
D: the film thickness was distributed in the range of 30 Å or more.

With respect to the reduction of thickness, how much the thickness of the resist film was reduced was measured when the resist was developed after the top anti-reflection coating was formed on the surface thereof. Specifically, first a resist composition for KrF exposure (DX5240P [trademark], manufactured by AZ Electronic Materials (Japan) K.K.) was cast on a substrate and then heated to form a resist film, whose thickness was measured. Thereafter, the resist film was coated with each top anti-reflection coating composition and then developed. The thickness of the developed resist film was measured, and the amount of the thickness change was regarded as the reduction of thickness. According to the reduction of thickness, the top anti-reflection coating compositions were classified into the following grades:
A: the reduction of thickness was less than 50 nm,
B: the reduction of thickness was 50 to 70 nm,
C: the reduction of thickness was 70 to 90 nm, and
D: the reduction of thickness was 100 nm or more.

With respect to the refractive index, each top anti-reflection coating composition was cast and heated to form a coating, whose refractive index was measured. The measurement was carried out at 248 nm by means of an ellipsometer (VUV-302 [trademark], manufactured by J.A. Woollam (Japan) Co., Inc.). According to the obtained refractive indexes, the top anti-reflection coating compositions were classified into the following grades:
A: the refractive index was smaller than or almost the same as that of Example 20,
B: the refractive index was larger than that of Example 20 by less than +0.05,
C: the refractive index was larger than that of Example 20 by +0.05 to +0.10, and
D: the refractive index was larger than that of Example 20 by +0.10 or more.

With respect to the temporal stability, each top anti-reflection coating composition was left at 40° C. and regularly sampled to count the number per unit volume of 0.2 μm-diameter particles contained therein. In every composition, the number of the particles was found to be 10 pcs/mL(unit) or less immediately after the composition was prepared. However, according to how many days it took for those particles to increase to more than 50 pcs/mL, the coating compositions were classified into the following grades:
A: 90 days or more,
B: 30 to 90 days,
C: 14 to 30 days, and
D: less than 14 days.

In any of the above evaluations, the coating compositions classified into the grades A, B, C and D can be individually regarded as excellent, practically good enough, practically usable and practically unusable, respectively.

The results were as set forth in Table 1.

TABLE 1

| Ex. | | Polymer (1) Weight average molecular weight | Alkylsulfonic acid Compound | Content (wt %) | Film-formability | In-plane evenness | Refractive index | Thickness reduction | Temporal stability |
|---|---|---|---|---|---|---|---|---|---|
| 1 | Comparison | 73,000 | — | — | D | — | — | — | — |
| 2 | Comparison | 270,000 | — | — | D | — | — | — | — |
| 3 | Comparison | 340,000 | — | — | D | — | — | — | — |
| 4 | Comparison | 480,000 | — | — | D | — | — | — | — |
| 5 | Comparison | 690,000 | — | — | D | — | — | — | — |
| 6 | Comparison | 73,000 | S-1 | 1.0 | B | B | — | D | — |
| 7 | Invention | 340,000 | S-1 | 1.0 | B | B | — | B | — |
| 8 | Invention | 690,000 | S-1 | 1.0 | B | C | — | B | — |
| 9 | Comparison | 73,000 | S-1 | 2.5 | B | B | A | D | A |
| 10 | Invention | 340,000 | S-1 | 2.5 | B | B | A | B | A |
| 11 | Invention | 690,000 | S-1 | 2.5 | B | C | A | B | C |
| 12 | Comparison | 73,000 | S-1 | 5.0 | B | A | A | D | — |
| 13 | Invention | 340,000 | S-1 | 5.0 | A | A | A | C | — |
| 14 | Invention | 690,000 | S-1 | 5.0 | B | B | B | B | — |
| 15 | Comparison | 73,000 | S-1 | 7.5 | B | A | B | D | — |
| 16 | Invention | 340,000 | S-1 | 7.5 | B | A | B | B | — |
| 17 | Invention | 690,000 | S-1 | 7.5 | B | A | B | B | — |
| 18 | Comparison | 340,000 | S-2 | 5.0 | The composition was clouded or precipitates were deposited. | | | | |
| 19 | Comparison | 340,000 | S-3 | 5.0 | The composition was clouded or precipitates were deposited. | | | | |
| 20 | Comparison | 480,000 | S-4 | 5.0 | B | B | A | C | — |
| 21 | Comparison | 340,000 | S-5 | 5.0 | D | — | — | — | — |
| 22 | Comparison | 340,000 | S-6 | 5.0 | D | — | — | — | — |
| 23 | Comparison | 340,000 | S-7 | 5.0 | D | — | — | — | — |
| 24 | Comparison | 340,000 | S-8 | 5.0 | D | — | — | — | — |
| 25 | Comparison | 340,000 | S-9 | 5.0 | B | — | — | — | D |

The above results indicate the following facts.

The results of Examples 1 to 5 reveal that, independently of the molecular weight of the polymer, the coating composition containing no alkylsulfonic add has such poor film-formability that it cannot be used for forming a top anti-reflection coating.

The results of Examples 6 to 17 show how the properties depend on the average molecular weight of the polymer and also on the content of the alkylsulfonic acid. Form those results, it was found that the alkylsulfonic acid is indispensable and the content thereof is 0.02 wt % or more so as to obtain satisfying properties. However, it was also found that, if the polymer has too small a molecular weight, the thickness is so reduced that the composition is difficult to use for forming a top anti-reflection coating.

Further, the results of Examples 18 to 25 exhibit that, if containing surfactants other than the alkylsulfonic acid specified in the present invention, the composition suffers from troubles. Specifically, the composition becomes clouded or poor in film-formability. The procedures of Examples 18 and 19 were repeated except for changing the molecular weight of the polymer and the content of the alkylsulfonic acid. Even so, however, all the obtained compositions were clouded or precipitates were deposited.

Further, the composition of the present invention was found to be superior in film-formability to a composition (of Example 20) in which the alkylsulfonic acid was replaced with a mixture of alkyldiphenylether sulfonic acids having 12 carbon atoms on average. The composition of Example 20 corresponds to the conventional top anti-reflection coating composition disclosed in Patent document 5. Furthermore, it was also found that the composition containing dodecylbenzenesulfonic acid, which is a popularly used surfactant, has allowable film-formability but insufficient temporal stability.

Examples 26 to 31

In each Example, a fluorine-containing polymer represented by the formula (1) and having a weight average molecular weight of 340000, an alkylsulfonic acid S-1 or S-4, and a different amine compound were mixed to prepare a top anti-reflection coating composition. The contents of the polymer, the alkylsulfonic acid and the amine compound were 2.0 wt %, 0.1 wt % and 0.2 wt %, respectively, based on the total weight of the composition. Each obtained composition was evaluated in the same manner as in Examples 1 to 25. The results were as set forth in Table 2, in which the results of Examples 13 and 20 in Table 1 were also shown again for reference.

TABLE 2

| Ex. | | Alkylsulfonic acid compound | Amine compound | Film-formability | In-plane evenness | Refractive index | Thickness reduction |
|---|---|---|---|---|---|---|---|
| 13 | Invention | S-1 | — | A | A | A | C |
| 20 | Comparison | S-4 | — | B | B | A | C |

TABLE 2-continued

| Ex. | | Alkylsulfonic acid compound | Amine compound | Film-formability | In-plane evenness | Refractive index | Thickness reduction |
|---|---|---|---|---|---|---|---|
| 26 | Invention | S-1 | monoethanolamine | A | A | B | A |
| 27 | Comparison | S-4 | monoethanolamine | B | B | C | B |
| 28 | Invention | S-1 | diethanolamine | B | B | B | A |
| 29 | Comparison | S-4 | diethanolamine | C | C | C | B |
| 30 | Invention | S-1 | triethanolamine | B | B | B | B |
| 31 | Comparison | S-4 | triethanolamine | C | C | C | C |

The above results reveal that, whether the amine compound is contained or not, the composition according to the present invention tends to be improved in film-formability and in in-plane evenness as compared with the compositions containing conventional surfactants. Further, it was also found that the composition containing the amine compound is also improved in refractive index and in thickness reduction. That composition is particularly preferably applied to chemically amplified resists.

Examples 32 to 37

In each Example, a fluorine-containing polymer represented by the formula (1) and having a weight average molecular weight of 340000, an additional polymer and an alkylsulfonic acid S-1 were mixed to prepare a top anti-reflection coating composition. The additional polymer was polyacrylic acid P-1 (weight average molecular weight: 5000) or polyvinylpyrrolidone P-2 (weight average molecular weight: 5000). The total amount of all the polymers and the content of the alkylsulfonic acid were 2.0 wt % and 0.1 wt %, respectively, based on the total weight of each composition. The ratio between the fluorine-containing polymer and the additional polymer was as shown in Table 3. Each obtained composition was evaluated in the same manner as in Examples 1 to 25. In the evaluation of thickness reduction, a resist composition for i-line light exposure (MiR703 [trademark], manufactured by AZ Electronic Materials (Japan) K.K.) was used. The results were as set forth in Table 3.

TABLE 3

| | | Polymer (1) | Additional polymer | | | | | |
|---|---|---|---|---|---|---|---|---|
| Ex. | | Content (wt %) | Compound | Content (wt %) | Film-formability | In-plane evenness | Thickness reduction | Refractive index |
| 32 | Invention | 70 | P-1 | 30 | B | B | B | B |
| 33 | Invention | 50 | P-1 | 50 | B | B | A | C |
| 34 | Invention | 30 | P-1 | 70 | C | C | — | C |
| 35 | Invention | 70 | P-2 | 30 | C | C | — | — |
| 36 | Invention | 50 | P-2 | 50 | C | C | — | — |
| 37 | Invention | 30 | P-2 | 70 | C | C | — | — |

The invention claimed is:

1. A top anti-reflection coating composition comprising a solvent,
an alkylsulfonic acid having 10 to 18 carbon atoms, and
a fluorine-containing polymer having a weight average molecular weight of 300000 to 800000 and represented by the following formula (1): $-A_x-B_y-$ (1) in which
A is a repeating unit represented by the following formula (A):

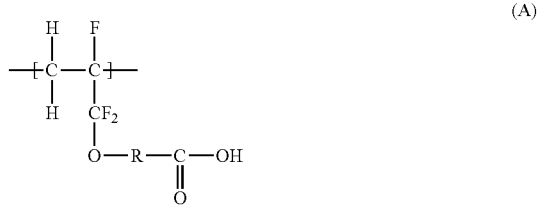

wherein R is a fluorine-containing alkylene group having 1 to 40 carbon atoms or R is a fluorine-containing alkylene group having 2 to 100 carbon atoms and an ether bond,
B is a repeating unit capable of combining with A to form a copolymer,
x and y are numbers indicating the polymerization ratios provided that x is not equal to 0, and
A and B may randomly combine with each other or may form blocks.

2. The top anti-reflection coating composition according to claim 1, wherein said alkylsulfonic acid is contained in an amount of 0.02 to 0.4 wt % based on the total weight of the composition.

3. The top anti-reflection coating composition according to claim 2, wherein said fluorine-containing polymer has a weight average molecular weight of 350000 to 450000.

4. The top anti-reflection coating composition according to claim 1, wherein said fluorine-containing polymer has a weight average molecular weight of 350000 to 450000.

5. The top anti-reflection coating composition according to claim 1, further containing a no fluorine-containing polymer having a carboxy group.

6. The top anti-reflection coating composition according to claim 1, further containing an amine compound selected from the group consisting of monoalkanol amines, dialkanol amines, trialkanol amines, and monoalkyl amines.

7. The top anti-reflection coating composition according to claim 6, wherein said amine is a monoalkanol amine.

8. The top anti-reflection coating composition according to claim 7, wherein said amine is monoethanol amine.

9. The top anti-reflection coating composition according to claim 1, wherein the solid content is 0.1 to 50 wt % based on the total weight of the composition.

10. A pattern formation method comprising the steps of: coating a substrate with a resist composition to form a resist film; coating said resist film with the top anti-reflection coating composition according to claim 1; drying said composition; conducting exposure by use of light; and then carrying out development.

11. The pattern formation method according to claim 10; wherein said top anti-reflection coating composition further contains a no fluorine-containing polymer having a carboxy group, and the light for exposure has a wavelength of 300 nm or more.

12. The pattern formation method according to claim 10; wherein said top anti-reflection coating composition further contains an amine compound selected from the group consisting of monoalkanol amines, dialkanol amines, trialkanol amines, and monoalkyl amines, and the light for exposure has a wavelength of 300 nm or less.

13. The top anti-reflection coating composition according to claim 1, wherein R is chosen from the group consisting of
—$CF_2O$—, —$CF(CF_3)$—, —$CF(CF_3)CF_2OCF(CF_3)$—, —$CF(CF_3)CF_2OCF(CF_3)CF_2OCF(CF_3)$—, —$CF(CF_3)CH_2$—,
—$CF(CF_3)CF_2OCF(CF_3)CH_2$—, and
—$CF(CF_3)CF_2OCF(CF_3)CF_2OCF(CF_3)CH_2$—.

14. The top anti-reflection coating composition according to claim 1, wherein the fluorine containing polymer comprise two or more kinds of the repeating unit of formula (A), but having different R's.

15. The top anti-reflection coating composition according to claim 1, wherein the repeating unit B is derived from a fluorine-containing hydrocarbon having an ethylenic unsaturated bond.

16. The top anti-reflection coating composition according to claim 1, wherein the repeating unit B is chosen from the group consisting of
—$CF_2CF_2$—, —$CF_2CHF$—, —$CF_2CH_2$—, —$CF_2CF(CF_3)$—, —$CF_2CFCl$—, and —$CH_2CH(CF_3)$—.

17. The top anti-reflection coating composition according to claim 1, wherein in formula (1), x is equal or greater than 0.55 and equal or smaller than 1.00 and where y is either 0 or equal or smaller than 0.45.

18. The top anti-reflection coating composition according to claim 1, wherein in formula (1), x is equal or greater than 0.70 and equal or smaller than 1.00 and where y is either 0 or equal or smaller than 0.30.

19. The top anti-reflection coating composition according to claim 1, wherein in formula (1), x is equal or greater than 0.90 and equal or smaller than 1.00 and where y is either 0 or equal or smaller than 0.10.

20. The top anti-reflection coating composition according to claim 1, wherein said alkylsulfonic acid is represented by the formula: $H(CH_2)_nSO_3H$ wherein n ranges from 10 to 18.

* * * * *